(12) United States Patent
Bae (10) Patent No.: US 8,082,632 B2
(45) Date of Patent: Dec. 27, 2011

(54) HINGE DEVICE FOR PORTABLE TERMINAL HAVING SUB-HOUSING STOPPER

(75) Inventor: Kwang-Jin Bae, Gumi-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 626 days.

(21) Appl. No.: 10/795,424

(22) Filed: Mar. 9, 2004

(65) Prior Publication Data

US 2005/0005401 A1    Jan. 13, 2005

(30) Foreign Application Priority Data

Jun. 30, 2003   (KR) .................................. 2003-43838

(51) Int. Cl.
E05D 11/06 (2006.01)
(52) U.S. Cl. ........................................... 16/374; 16/376
(58) Field of Classification Search .................... 16/297,
16/302, 319, 344, 362, 363, 367, 34.4, 383,
16/374–37, 330, 321–324, 335, 258, 349,
16/266, 327, 332, 341–342; 455/90, 550,
455/556, 575, 575.1, 575.3, 558, 90.3; 361/681–683,
361/803, 804, 681.883, 881–883, 679.56;
379/433.11, 433.13, 433, 428, 42 B, 493.11,
379/428.01; 403/104
See application file for complete search history.

(56) References Cited

U.S. PATENT DOCUMENTS

| | | | | |
|---|---|---|---|---|
| 3,583,734 A * | 6/1971 | Magi | ............................... | 403/96 |
| 4,987,640 A * | 1/1991 | Lin | ................................. | 16/327 |
| 5,123,768 A * | 6/1992 | Franklin | ........................... | 403/96 |
| 5,333,356 A * | 8/1994 | Katagiri | .......................... | 16/340 |
| 5,412,842 A * | 5/1995 | Riblett | ............................ | 16/334 |
| 5,507,719 A * | 4/1996 | Freeman | .......................... | 602/26 |
| 5,509,332 A * | 4/1996 | Donaldson, Jr. | ................ | 81/59.1 |
| 5,918,347 A * | 7/1999 | Morawetz | ........................ | 16/322 |
| 6,092,264 A * | 7/2000 | Banks | .............................. | 16/321 |
| 6,591,533 B2 * | 7/2003 | Wygant | .............................. | 42/72 |
| 6,609,273 B1 * | 8/2003 | Yamada et al. | .................. | 16/332 |
| 6,804,861 B2 * | 10/2004 | Hsu | .................................. | 16/366 |
| 6,805,513 B2 * | 10/2004 | Marquina | ...................... | 403/107 |
| 6,883,206 B2 * | 4/2005 | Yang et al. | ....................... | 16/337 |
| 7,203,996 B2 * | 4/2007 | Linnenbrink et al. | ........... | 16/334 |
| 7,581,291 B2 * | 9/2009 | Abe et al. | .......................... | 16/367 |
| 2003/0075649 A1 * | 4/2003 | Jeong et al. | .................... | 248/157 |
| 2004/0110529 A1 * | 6/2004 | Watanabe et al. | ........... | 455/550.1 |
| 2004/0127262 A1 * | 7/2004 | Ohno | .............................. | 455/566 |
| 2005/0119023 A1 * | 6/2005 | Sudo et al. | .................. | 455/550.1 |
| 2005/0137000 A1 * | 6/2005 | Toh et al. | .................... | 455/575.4 |

* cited by examiner

*Primary Examiner* — Robert Sandy
*Assistant Examiner* — Matthew Sullivan
(74) *Attorney, Agent, or Firm* — Roylance, Abrams, Berdo & Goodman, L.L.P.

(57) ABSTRACT

A hinge device in a portable terminal is provided. In the hinge device, a first hinge base has a stopper protrusion at a predetermined position on an outer circumferential surface thereof. A second hinge base is rotatably engaged with an end of the first hinge base, facing the first hinge base, and fixed within a cylindrical hinge housing. The hinge housing has a stopper which pops out therefrom when the stopper contacts the stopper protrusion. The stopper restricts an angle at which a sub-housing is opened from a main housing in the portable terminal. Thus, a voice call can be conducted conveniently.

15 Claims, 12 Drawing Sheets

HINGE DEVICE FOR PORTABLE TERMINAL HAVING SUB-HOUSING STOPPER

PRIORITY

This application claims priority under 35 U.S.C. §119 to an application entitled "Hinge Device for Portable Terminal Having Sub-Housing Stopper" filed in the Korean Intellectual Property Office on Jun. 30, 2003 and assigned Serial No. 2003-43838, the entire contents of which are incorporated herein by reference.

BACKGROUND OF THE INVENTION

1. Field of the Invention

The present invention relates generally to a portable terminal, and in particular, to a 2-axis rotatable portable terminal having a stopper for restricting an angle at which a sub-housing is opened.

2. Description of the Related Art

Generally, a portable terminal refers to a device which a user carries and uses to wirelessly communicate with other parties. Portable terminals are categorized as a bar type, a flip type, and a folder type according to their configuration. Bar-type portable terminals are configured to have a bar-shaped single housing. Flip-type portable terminals are configured such that a flip or cover is rotatably mounted to a bar-shaped housing by means of a hinge device, whereas folder-type portable terminals are configured such that a sub-housing is rotatably mounted to a bar-shaped main housing by means of a hinge device so that it is foldable.

Portable terminals can also be categorized as rotation type and sliding type terminals according to their opening mechanism. Rotation-type portable terminals are configured such that two housings are rotatably connected, facing each other, whereas sliding-type portable terminals are configured such that one of two housings slides lengthwise to an open state, facing the other housing. The portable terminals described above are well known to those skilled in the art.

Such conventional portable terminals are necessarily equipped with an antenna device, a data input/output device, and a data transmitting/receiving device. As is well known, a keypad is commonly used as the data input device. The keypad is configured to input data when the keys provided thereon are depressed by a user's finger. A touch pad or touch screen is also often used. A liquid crystal display (LCD) is commonly adopted as the data output device.

The keypad used to input data has an arrangement consisting of a plurality of keys which include numeral keys, character keys, a send (SND) key), an end (END) key, and function keys, among others. There can be as many as 15 to 20 keys arranged at appropriate positions on the top surface of a portable terminal. As is well known, the keys protrude upward so that the user can input data by depressing them. In addition, conventional portable terminals are equipped with a camera lens as a photographing means to conduct video calling or to acquire an image of an intended object.

Currently, users' tastes regarding portable terminals have diversified; many users are increasingly information (i.e., internet/e-mail) oriented. It is very inconvenient, however, to communicate with conventional portable terminals using the Internet or a multimedia environment. This is particularly due to the configuration of portable terminals. In many portable terminals the data output device, or LCD, is fixed or rotatable in only one direction. Thus, a rather uncomfortable pose is required by users for communications. Moreover, there are no specific methods of implementing new designs developed for portable terminals.

SUMMARY OF THE INVENTION

An object of the present invention is to substantially solve at least the above problems and/or disadvantages and to provide at least the advantages below. Accordingly, an object of the present invention is to provide a hinge device for a portable terminal, which meets diverse user tastes and demands.

Another object of the present invention is to provide a hinge device for a portable terminal which enables the portable terminal to be used conveniently in an Internet or multimedia environment.

A further object of the present invention is to provide a hinge device for a portable terminal having a stopper for restricting an angle at which a sub-housing is opened from a main housing.

The above objects are achieved by a hinge device in a portable terminal. According to one aspect of the present invention, a hinge device for a portable terminal comprises a first hinge base having a stopper protrusion at a predetermined position on an outer circumferential surface thereof. A second hinge base is rotatably engaged with an end of the first hinge base, facing the first hinge base, and is fixed within a cylindrical hinge housing. The hinge housing has a stopper which pops out therefrom when the stopper contacts the stopper protrusion.

According to another aspect of the present invention, a hinge device in a portable terminal comprises a sub-housing that can be opened from or closed to the main housing by rotating upon a first hinge axis, and wherein it faces the main housing by rotating upon a second hinge axis perpendicular to the first hinge axis. The hinge device provides the first and second hinge axes and connects the main housing to the sub-housing. A first hinge base is fixed at one end of the main housing and has a stopper protrusion at a predetermined position on an outer circumferential surface thereof. A second hinge base is rotatably engaged with the first hinge base so that the second hinge base rotates upon the second hinge axis and comes to a halt at predetermined angular intervals. A cylindrical hinge housing is engaged with an end of the sub-housing so that the hinge housing rotates upon the first hinge axis. The second hinge base is fixed in the hinge housing. The hinge housing includes a stopper which pops out from the hinge housing when the stopper contacts the stopper protrusion.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Referring to FIGS. 1 to 6, a hinge device 100 for a portable terminal according to a preferred embodiment of the present invention comprises a hinge housing 101, a first hinge base 102, and a second hinge base 103. The hinge housing 101 is provided with a stopper 10. The hinge housing 101 defines a first hinge axis A1 extended along the diameter direction thereof, and defines a second hinge axis A2 perpendicular to the first hinge axis A1 along with rotatable face-to-face engagement of the fist hinge base 102 and the second hinge base 103.

Figure 4:
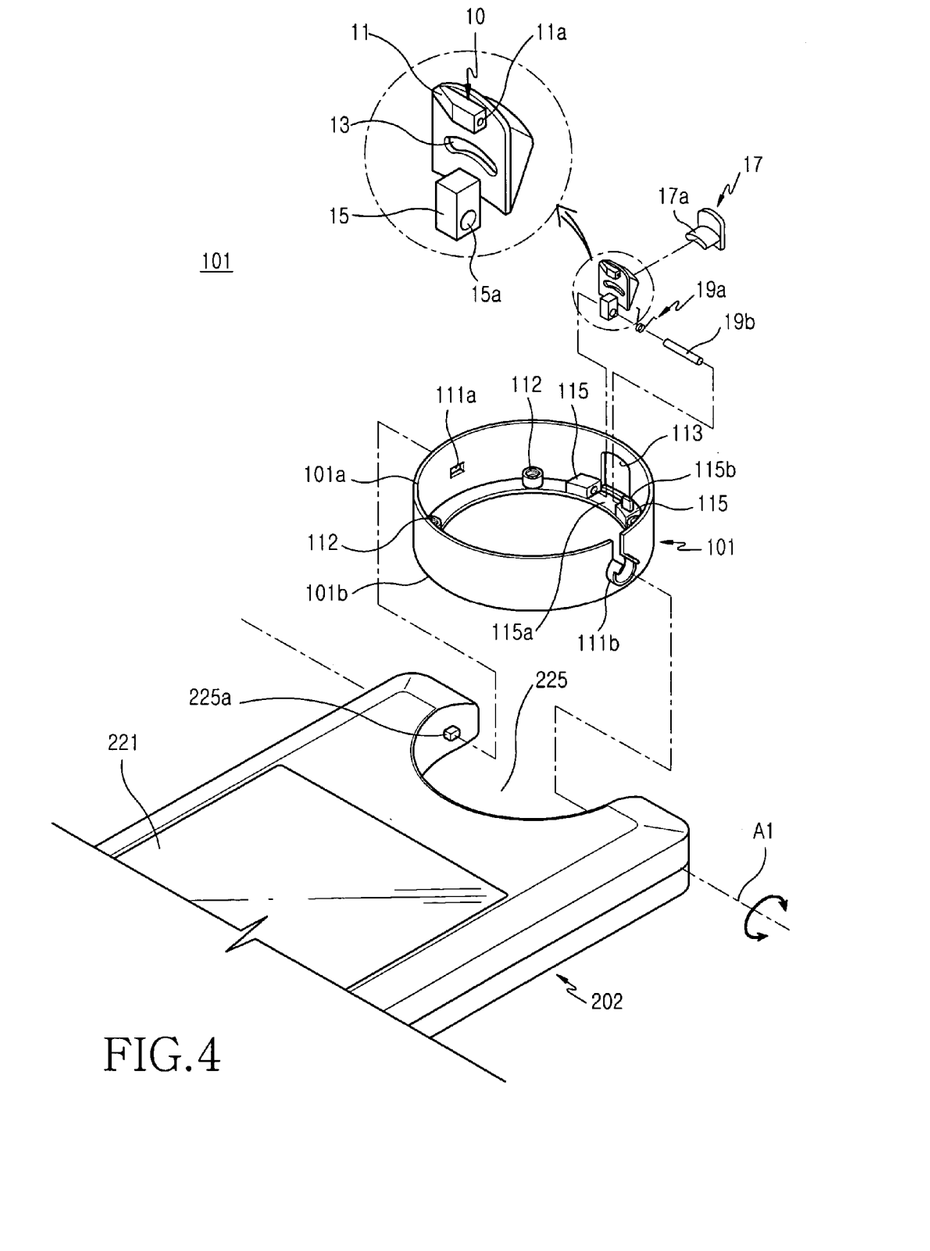
FIG. 4 is an exploded perspective view of a hinge housing in the hinge device illustrated in FIG. 1.

The hinge housing 101 is shaped into a cylinder fully opened at an end 101a and partially opened at the other end 101b. The first hinge axis A1 extends along the diameter direction of the hinge housing 101. The hinge housing 101 is further provided, at an outer circumferential surface, with a hinge hole 111a and a hinge protrusion 111b aligned on the first hinge axis A1. Referring to FIG. 4, the hinge housing 101 is engaged with a sub-housing 202 by means of the hinge hole 111a and the hinge protrusion 111b so that it is rotatable.

The sub-housing 202 is provided, at an end thereof, with a semi-circular opening 225. An engagement protrusion 225a and an engagement hole (not shown) are formed on the inner circumferential surface of the opening 225, facing each other. As the hinge hole 111a fits around the engagement protrusion 225a and the hinge protrusion 111b fits into the engagement hole, the hinge housing 101 rotates upon the first hinge axis A1.

The hinge housing 101 is provided, at an inner surface thereof, with engagement portions 112 having a screw hole therein and, at an outer surface thereof, with a stopper 10 that pops in and out. A rubber or silicon elastic member 17 is attachable onto an outer surface of the stopper 10. Preferably, the elastic member 17 protrudes slightly from the outer surface of the stopper 10.

Referring again to FIG. 4, the hinge housing 101 is provided with a stopper hole 113 that allows the stopper 10 to pop in and out therethrough, and is further provided with support members 115 adjacent to the stopper hole 113. The support members 115 protrude from the inner surface from the hinge housing 101 and have pin holes 115a facing each other. It is preferred that the pin holes 115a are positioned at a lower portion of the stopper hole 113. One of the support members 115 has a support protrusion 115b extended upward therefrom. The support protrusion 115b is preferably spaced from the inner surface of the hinge housing 101 by a predetermined distance.

The stopper 10 is provided, at an upper portion of the inner surface thereof, with an operating protrusion 11 and, at a lower portion of the inner surface thereof, with a rotation protrusion 15 extended downward. A spring hole 11a is formed into the operating protrusion 11, and a fixing hole 13 penetrates through the inner and outer surfaces of the stopper 10. The fixing hole 13 functions to fix the elastic member 17. The elastic member 17 is provided, at one surface thereof, with a fixing protrusion 17a to be inserted into the fixing hole 13. The elastic member 17 can be directly attached onto the outer surface of the stopper 10 without using the fixing protrusion 17a. The stopper 10 is engaged with a pin 19b both ends of which are supported by the pin holes 115a so that it is rotatable. Specifically, the pin 19b is rotatably inserted into the rotation hole 15a and both ends of the pin 19b are then fit into the pin holes 115a. Because the pin holes 115a are located at the lower portion of the stopper hole 113, as the stopper 10 makes a rotational motion, its upper end pops out from the outer surface of the hinge housing 101. A torsion spring 19a can also be installed to provide elastic force such that the stopper 10 is positioned within the hinge housing 101.

The torsion spring 19a includes a coil wound around the pin 19b and first and second free ends extended from both ends of the coil in opposite directions. The first free end is supported by the stopper 10, specifically the spring hole 11a of the operating protrusion 11, while the second free end is supported by the hinge housing 101, specifically between the inner surface of the hinge housing 101 and the support protrusion 115b. As discussed above, the torsion spring 19a provides elastic force in the direction that positions the stopper 10 within the hinge housing 101.

Figure 5:
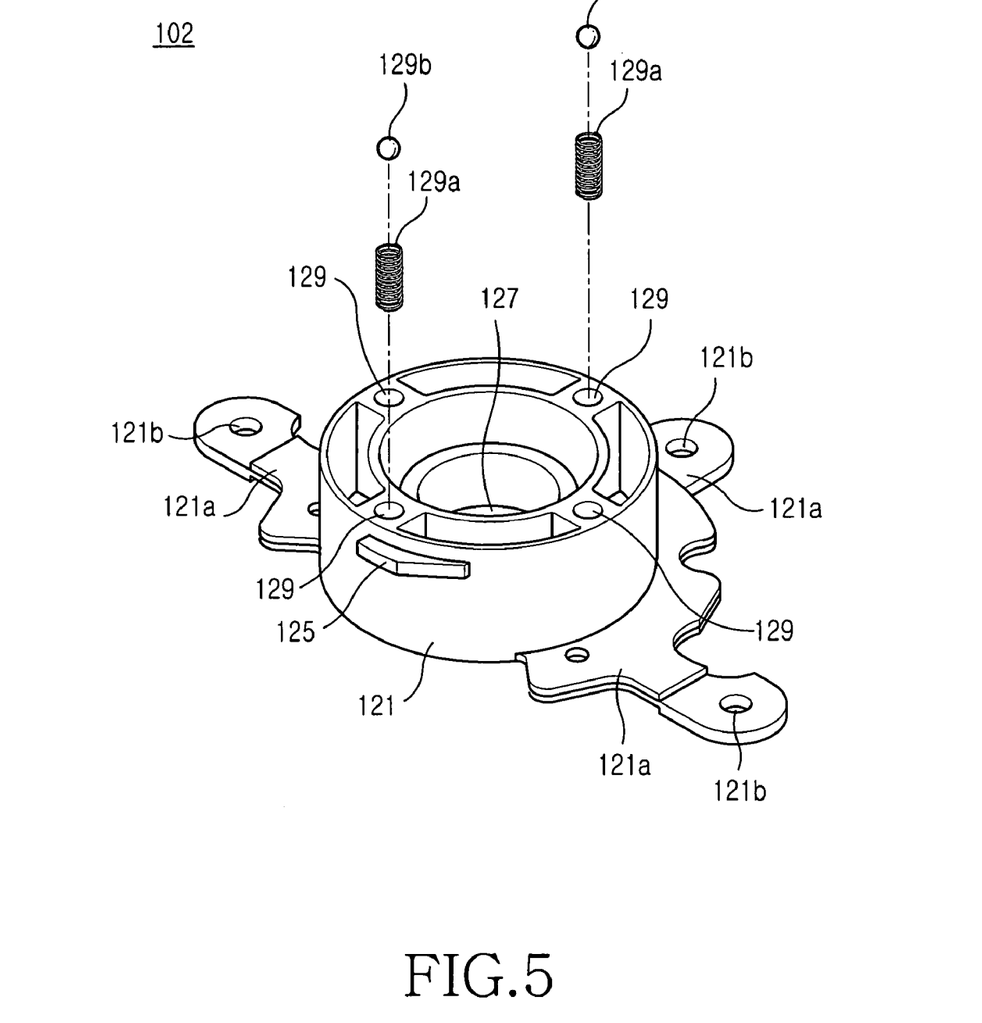
FIG. 5 is a perspective view of a first hinge base in the hinge device illustrated in FIG. 1.

As illustrated in FIG. 5, the first hinge base 102 comprises a cylindrical body 121 extending along the second hinge axis A2 and at least two engagement pieces 121a. Each engagement piece 121a extends in a diameter direction from the outer circumferential surface of one end of the body 121, and has an engagement hole 121b at an end portion thereof. The first hinge base 102 is further provided, at the outer circumferential surface of the other end thereof, with a stopper protrusion 125.

The first hinge base 102 further comprises a through hole 127 extending along the second hinge axis A2, and spring holes 129 in the vicinity of the through hole 127, elongated along the second hinge axis A2 from the surface of the other end of the first hinge base 102. It is preferred that at least a pair of spring holes 129 are equi-angularly spaced along the circumference of the first hinge base 102. A coil spring 129a and a spherical stepping ball 129b are inserted into each of the spring holes 129. The stepping balls 129b can pop out from the ends of the spring holes 129 by means of elastic force applied from the coil springs 129a thereto.

Figure 6:
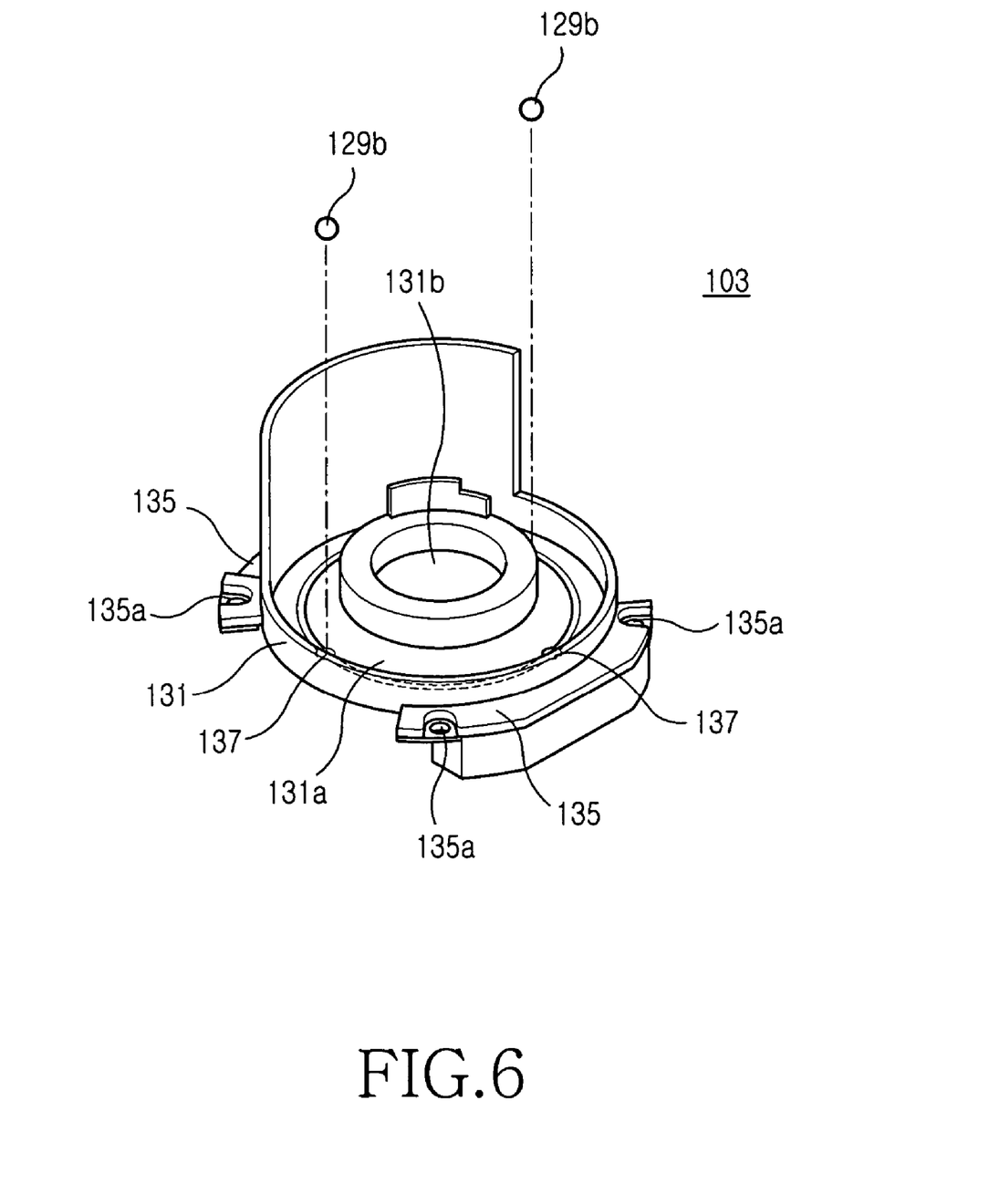
FIG. 6 is a perspective view of a second hinge base in the hinge device illustrated in FIG. 1.

As illustrated in FIG. 6, the second hinge base 103 is provided, around the periphery thereof, with a rib 131 extending along the second hinge axis A2 such that the rib 131 covers an end portion of the first hinge base 102. The second hinge base 103 is shaped like a cap. The rib 131 partially surrounds the outer circumferential surface of the other end of the first hinge base 102. The second hinge base 103 is rotatably combined with the other end of the first hinge base 102. The second hinge base 103 is provided with a through hole 131b aligned in line with the through hole 127 of the first hinge base 102. The second hinge base 103 is combined with the end portion of the first hinge base 102, facing each other, with the through holes 127 and 131b aligned on the second hinge axis A2. Stepping groves 137 are formed equi-angularly along the rotational trajectory of the stepping balls on the bottom surface 131a of the second hinge base 103. Therefore, during rotation, the second hinge base 103 can temporarily come to a halt where the stepping balls 129b are caught in the stepping grooves 137.

One or more engagement pieces 135 are extended from the outer circumferential surface of an end of the second hinge base 103. Each of the engagement pieces 135 is provided with one or more engagement holes 135a. The engagement holes 135a are positioned in correspondence with the engagement portions 112 of the hinge housing 101. The second hinge base 103 is fixed to the hinge housing 101 by, for example, screws. Thus, the hinge housing 101 rotates, facing the first hinge base 102. The stopper protrusion 125 can come into contact with the stopper 10, specifically the operating protrusion 11 of the stopper 10. The stopper 10 pops out from the hinge housing 101.

Figure 7:
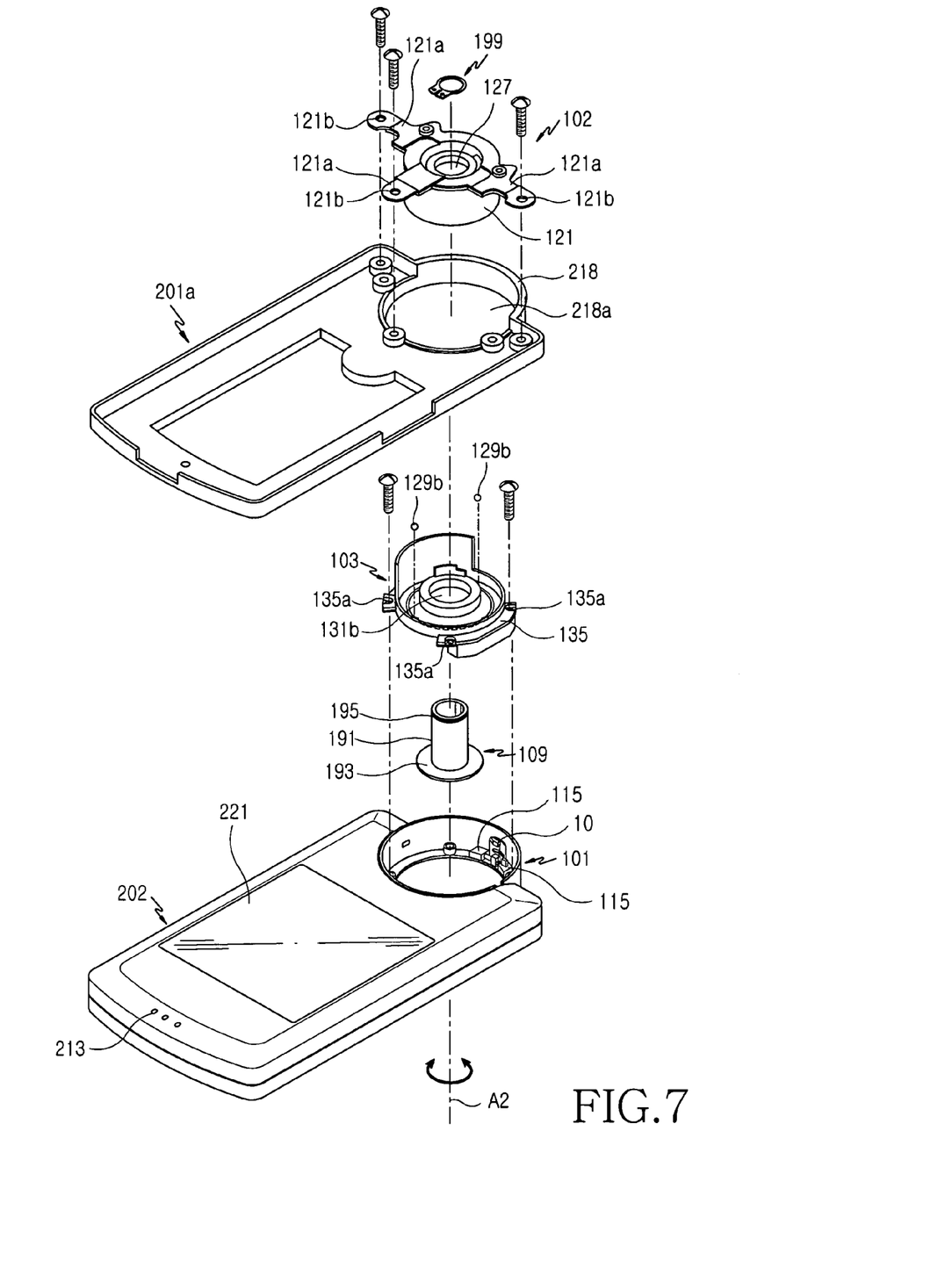
FIG. 7 is an exploded perspective view of the hinge device illustrated in FIG. 1 which is being assembled in the portable terminal.

Assembly of a main housing and the sub-housing 202 by the hinge device 100 will be described with reference to FIG. 7.

The hinge housing 101 has been rotatably combined with the sub-housing 202, as described above with reference to FIG. 4.

The first hinge base 102 is engaged in a front case 201a of the main housing. A semi-circular fixed housing 218 protrudes from an end of the front case 201a. The front case 201a is provided with an opening 218a surrounded by a portion of the outer circumferential surface thereof and the fixed housing 218. The first hinge base 102 in the opening 218a protrudes upward from the front case 201a.

The second hinge base 103 is engaged within the hinge housing 101 by, for example, a screw.

The first and second hinge bases 102 and 103 are engaged with each other by means of a hinge coupler 109 that extends along the second hinge axis A2. The hinge coupler 109 comprises a support plate 193 supported at an end of the second hinge base 103, a coupler shaft 191 extending from one surface of the support plate 193 through the through holes 127 and 131b of the first and second hinge bases 102 and 103, and a coupling groove 195 formed around the outer circumferential surface of an end of the coupler shaft 191 so that it is exposed from an end of the first hinge base. The coupling groove 195 is fit into a C-ring 199. Thus, the first and second hinge bases 102 and 103 are rotatably engaged with each other.

The hinge housing 101, the first hinge base 102 and the second hinge base 103 can be formed of a synthetic resin. Alternatively, they can be formed of a metal to increase durability.

FIGS. 8 to 12 illustrate a portable terminal 200 having the configuration as described above, in various states of BEIGN open or closed. The portable terminal 200 is provided with the main housing 201 and the sub-housing 202. The sub-housing 202 is engaged with the main housing 201 so that it can rotate upon the first and second hinge axes A1 and A2, respectively. The main housing 201 is provided, at one surface thereof, with a keypad 211 and a transmitter 213, whereas the sub-housing 202 is provided, at one surface thereof, with a display 221 and a receiver 223.

Figure 1:
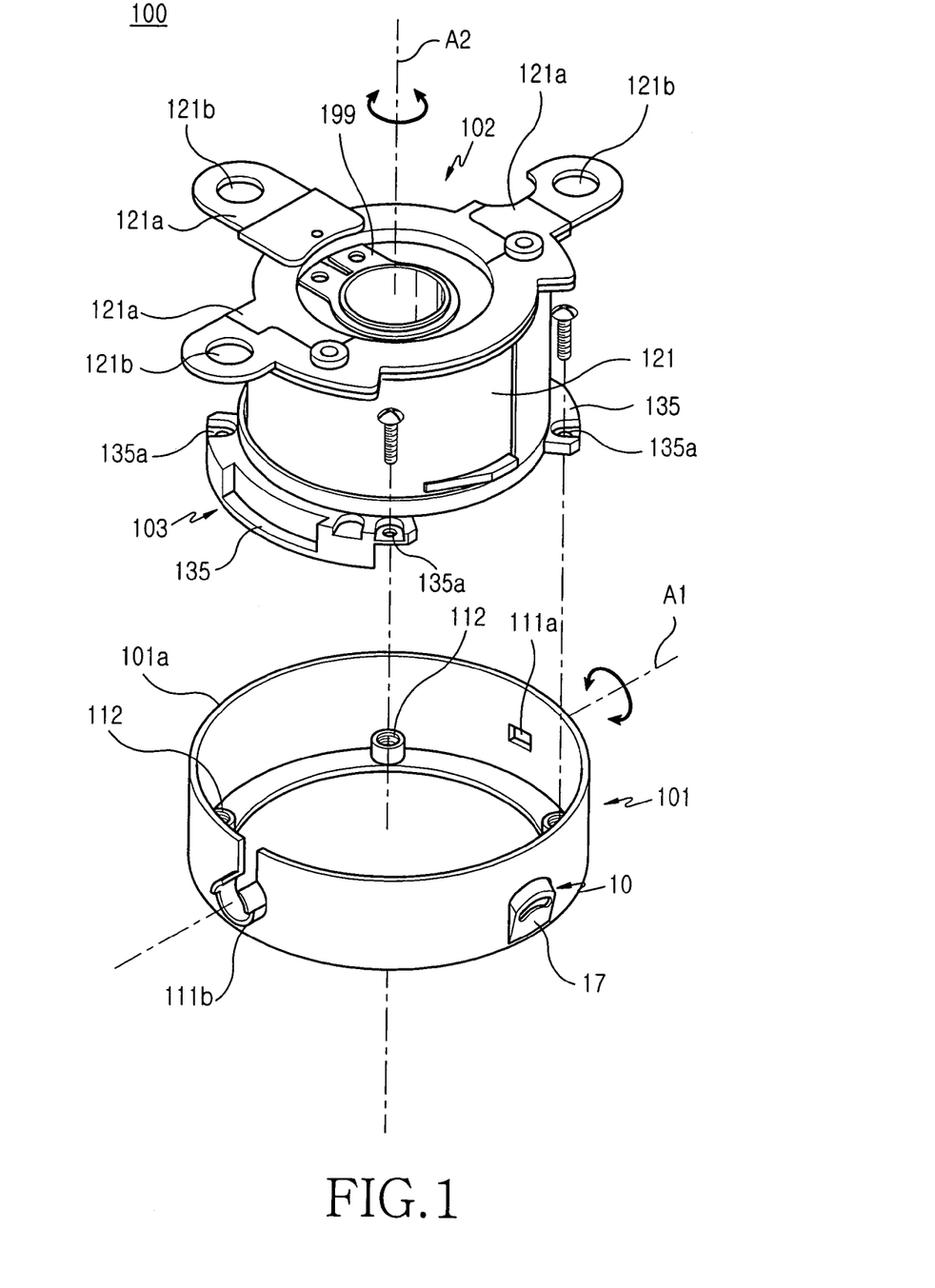
FIG. 1 is an exploded perspective view of a hinge device for a portable terminal according to an embodiment of the present invention.
Figure 2:
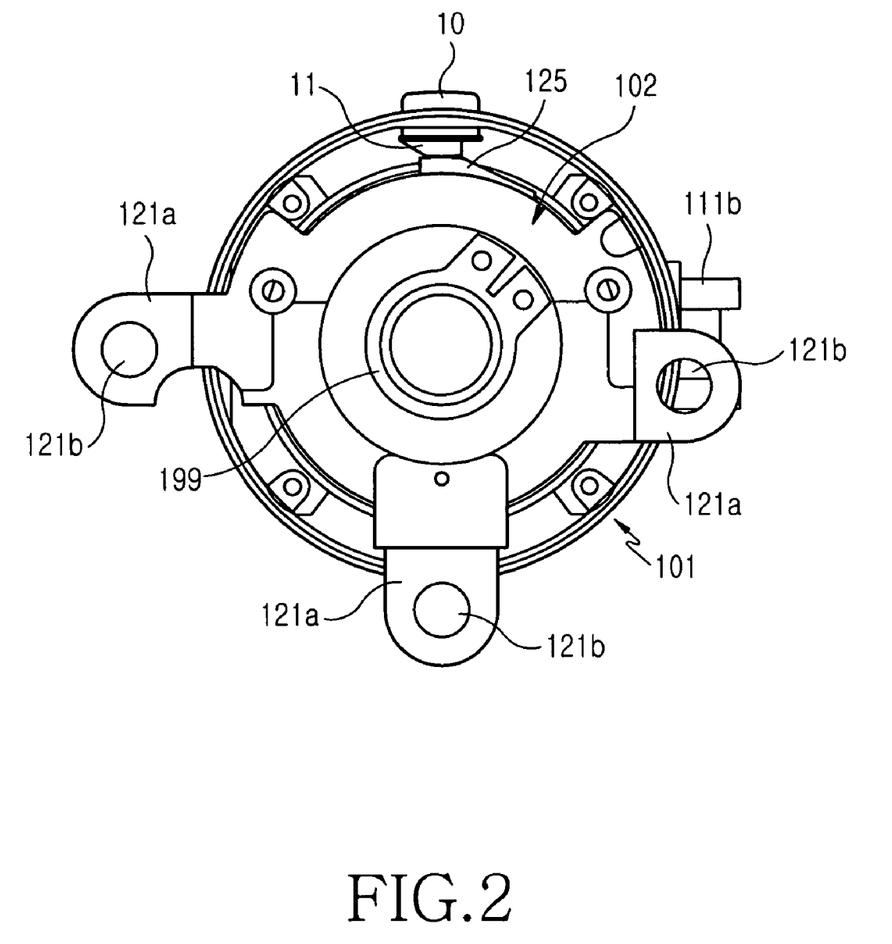
FIG. 2 is a plan view of the hinge device illustrated in FIG. 1.
Figure 3:
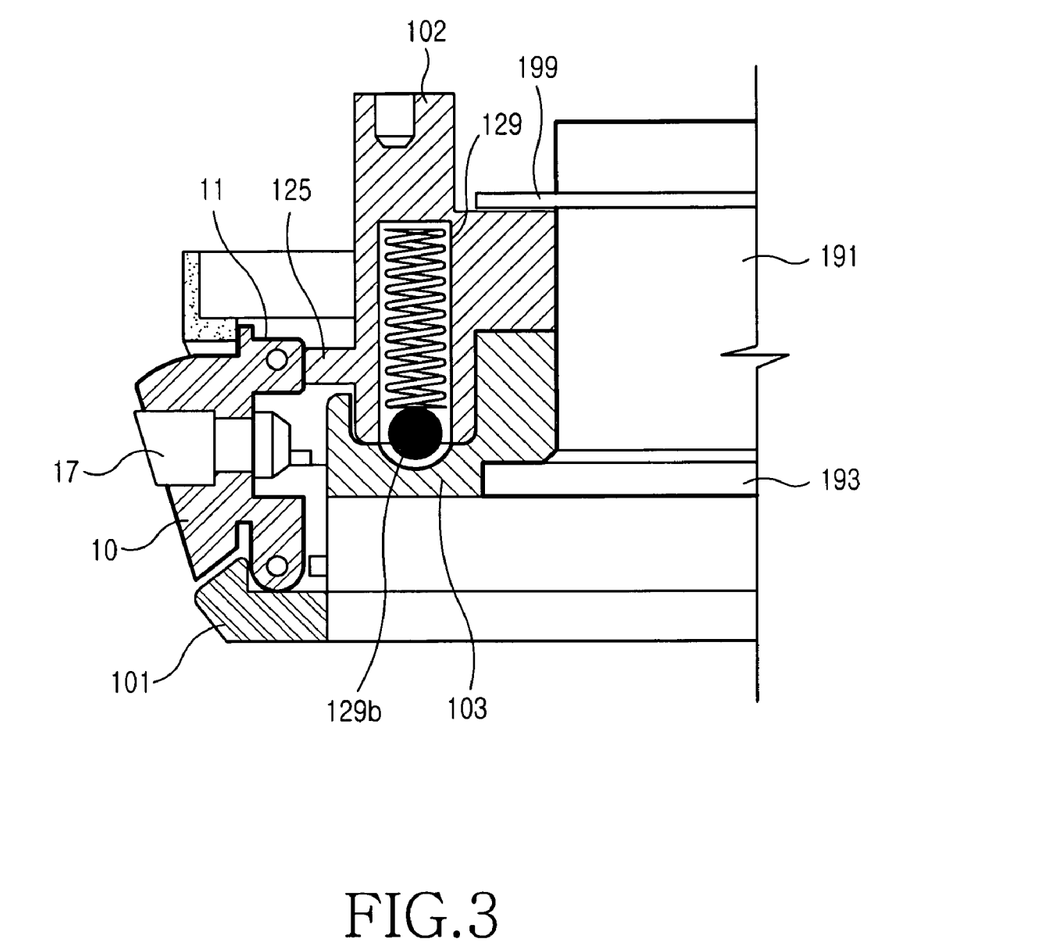
FIG. 3 is a side sectional view of the hinge device illustrated in FIG. 2.
Figure 8:
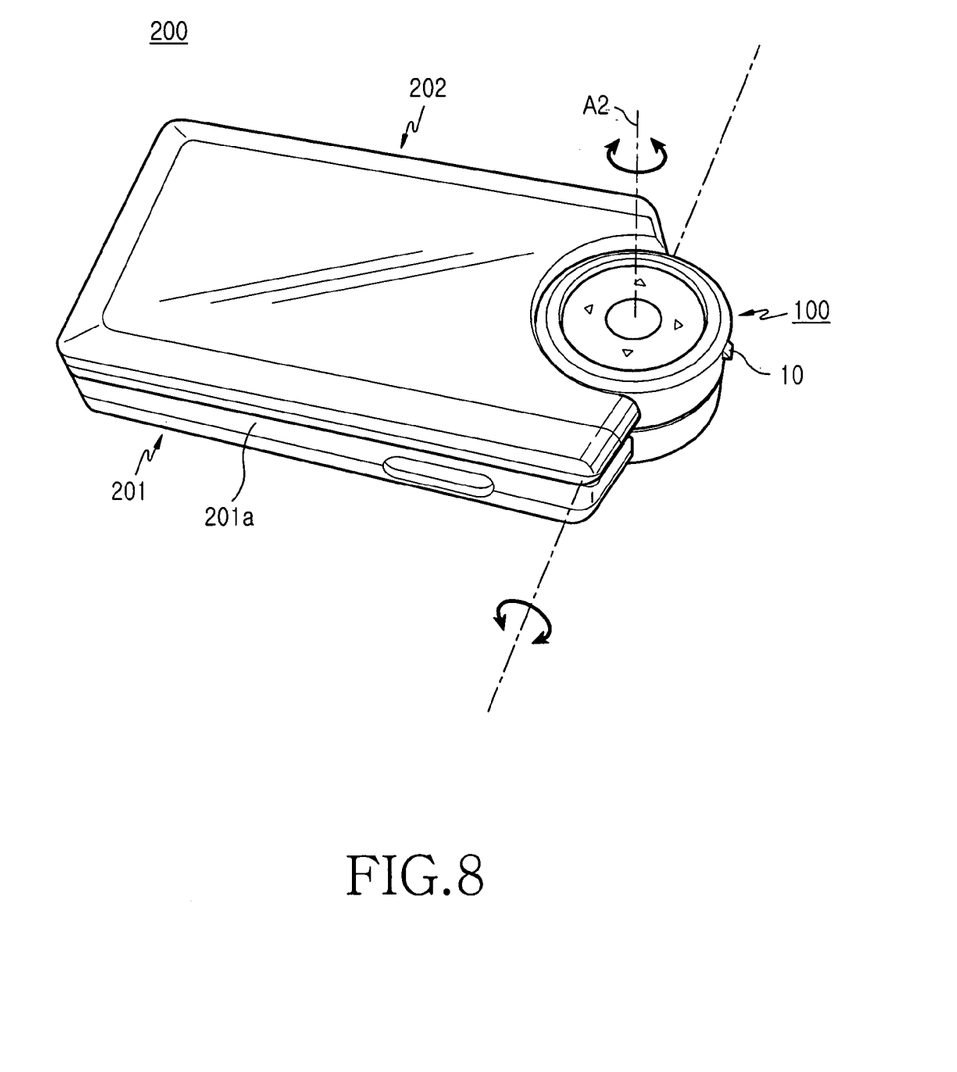
FIG. 8 is a perspective view of the portable terminal illustrated in FIG. 7.
Figure 9:
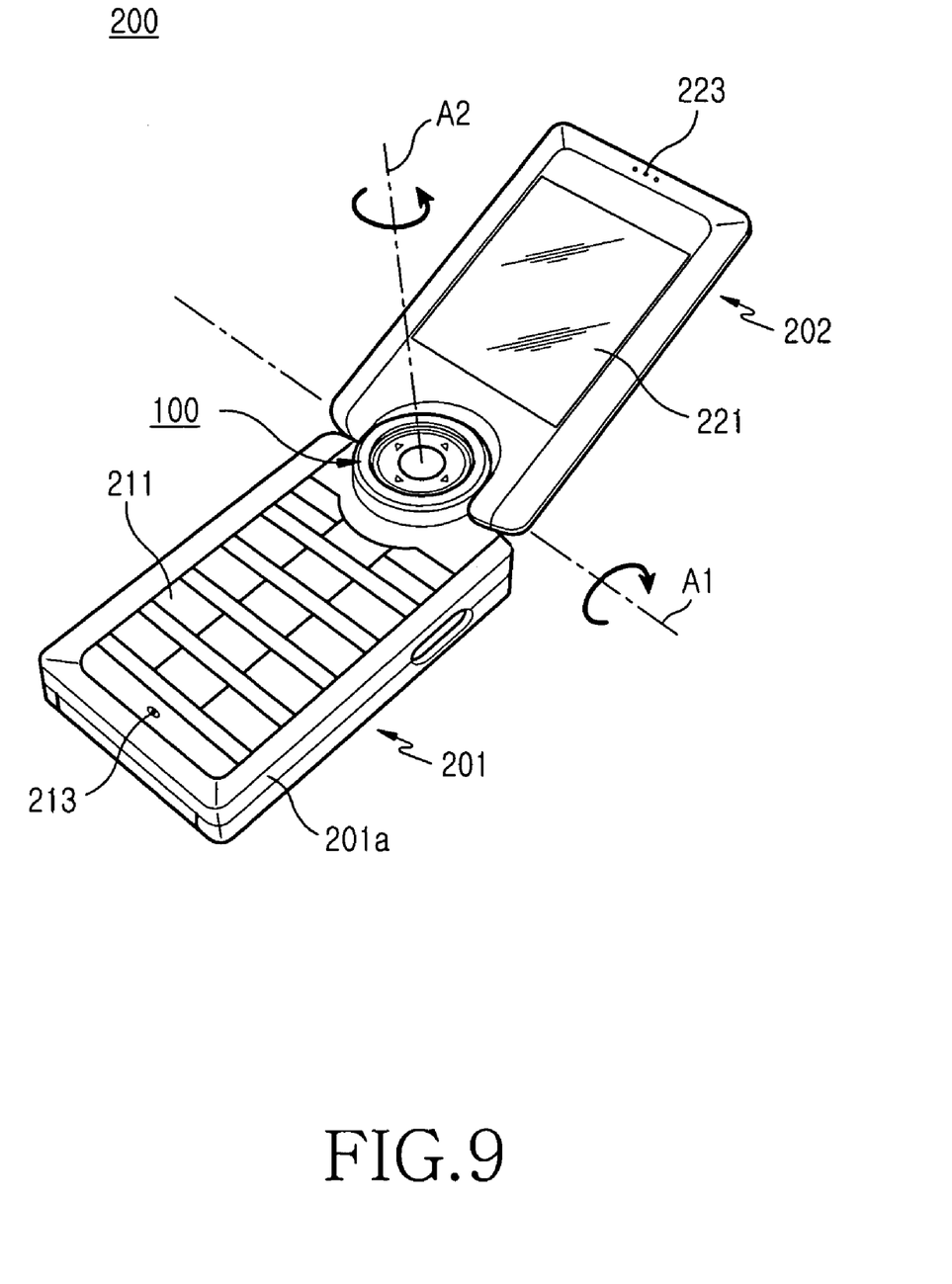
FIG. 9 is a perspective view of a sub-housing in an open state in the portable terminal illustrated in FIG. 8.
Figure 10:
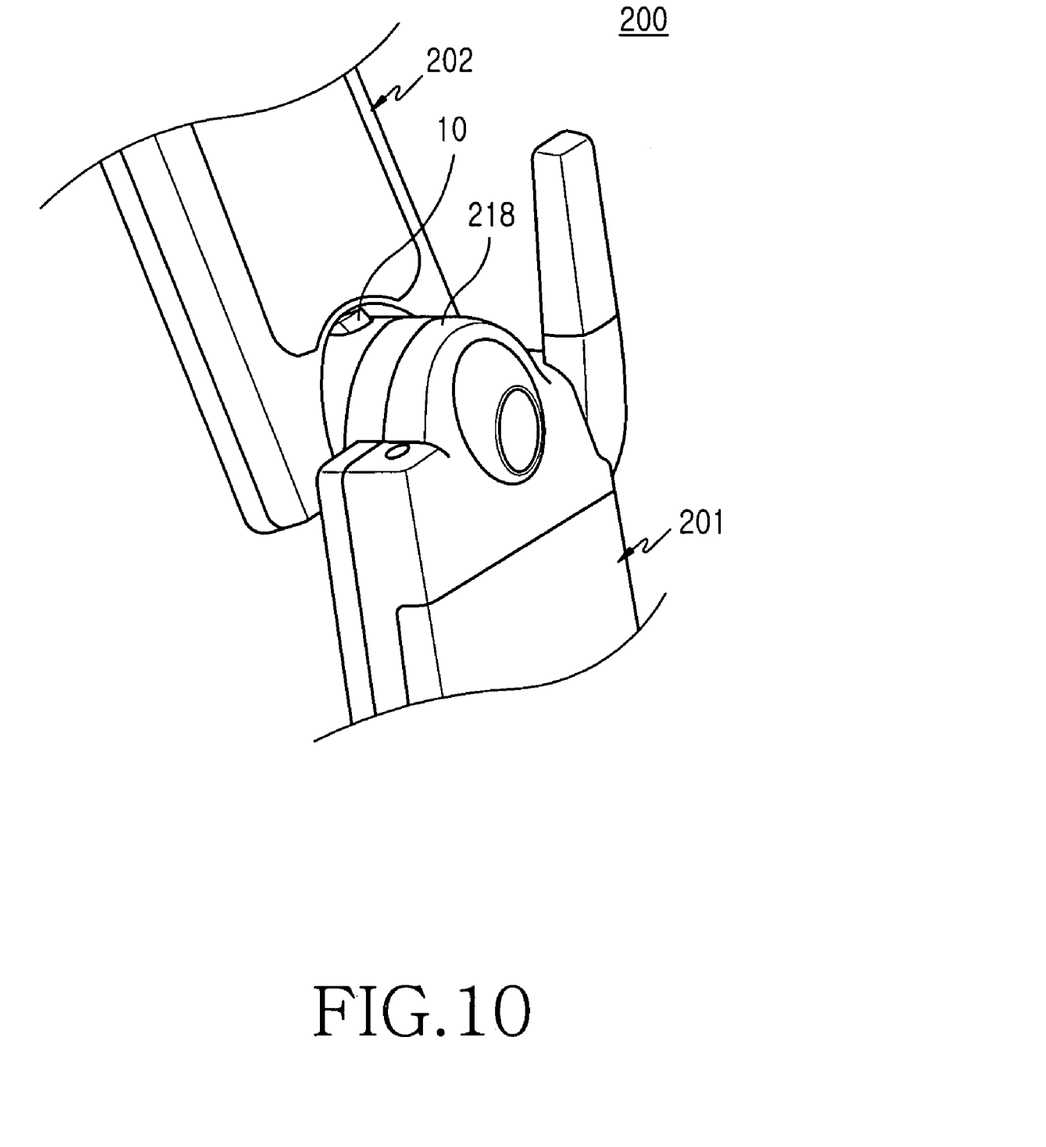
FIG. 10 is a perspective view illustrating the rear of the portable terminal illustrated in FIG. 9.

Referring to FIG. 8, the first hinge axis A1 is extended such that it is parallel to the width direction of the sub-housing 202 and perpendicular to the length direction thereof. The second hinge axis A2 is perpendicular to one surface of the sub-housing 202. With the sub-housing 202 in close contact with the main housing 201, the transmitter 213 and the receiver 223 are closed and the stopper 10 of the hinge device 100 protrudes from the hinge housing 101. The stopper 10 of the hinge device 100 protrudes from the hinge housing 101 because the stopper protrusion 125 of the first hinge base 102 has been brought into contact with the operating protrusion 11 of the stopper 10, as illustrated in FIG. 2 or 3. As the sub-housing 202 rotates upon the first hinge axis A1, the transmitter 213 and the receiver 223 are opened as illustrated in FIG. 9 or 10. As FIGS. 9 and 10 illustrate, the opened angle of the sub-housing 202 is restricted by the stopper 10. The sub-housing 202 can be opened at various angles according to how much the stopper 10 protrudes from the hinge housing 101. Preferably, the opened angle of the sub-housing 202 is limited to at or about 160°. The elastic member 17 on the outer surface of the stopper 10 absorbs the impact produced when the sub-housing 202 bumps against the stopper 10.

Figure 11:
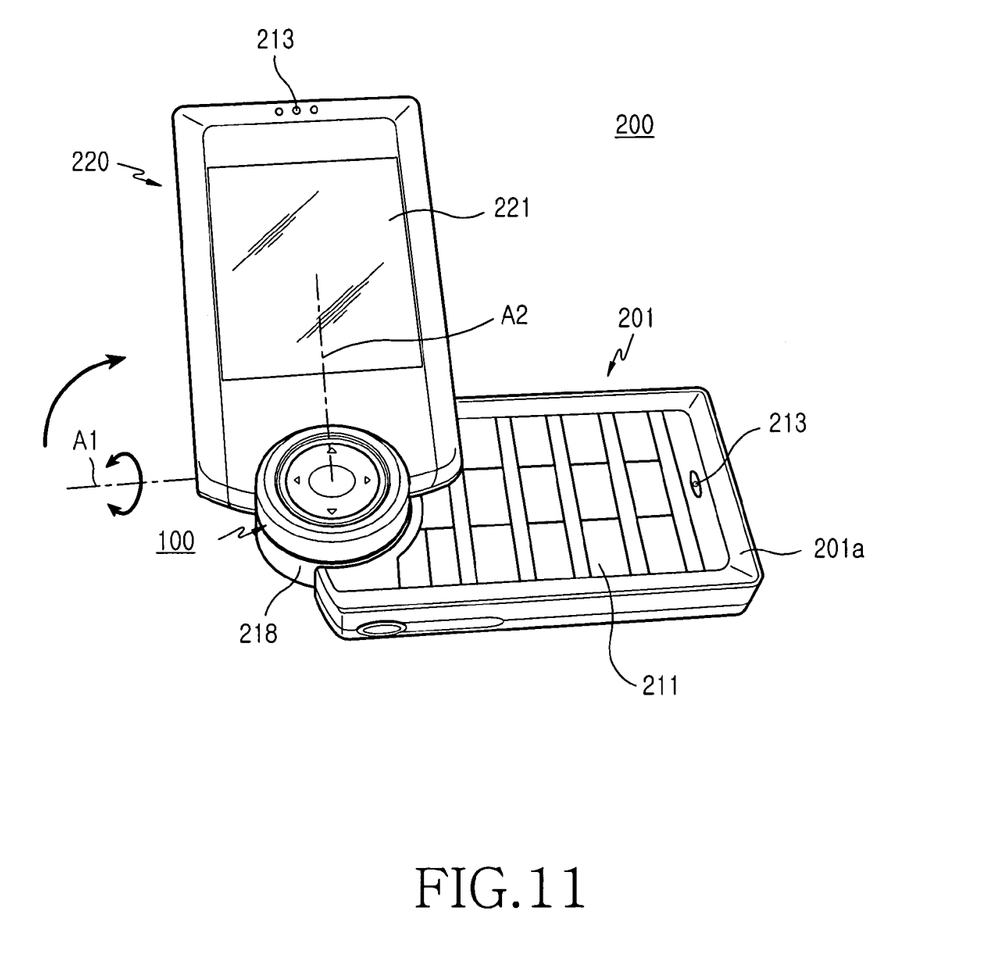
FIG. 11 is a perspective view illustrating the sub-housing being rotated with respect to a main housing, facing the main housing in the portable terminal illustrated in FIG. 8.
Figure 12:
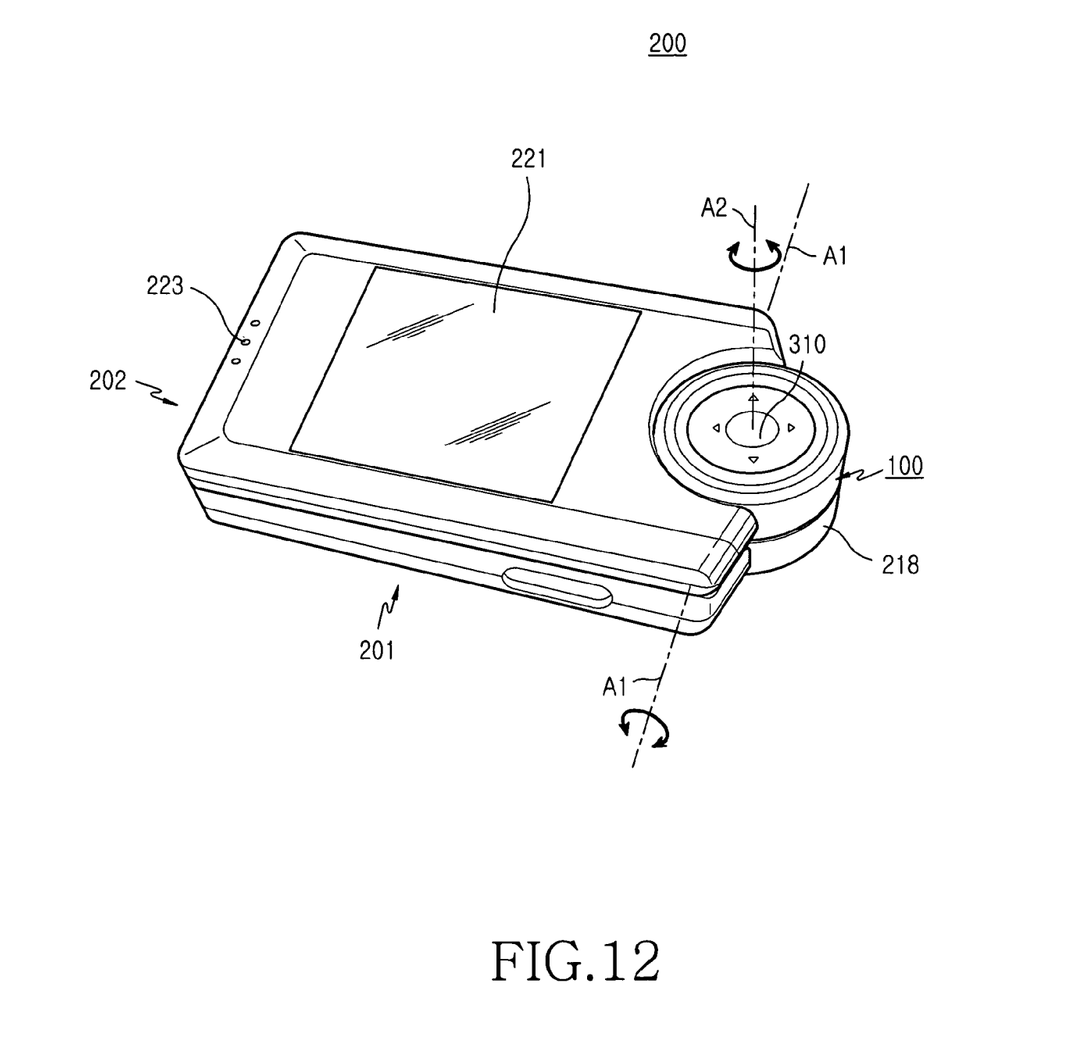
FIG. 12 is a perspective view of the portable terminal illustrated in FIG. 8, with the sub-housing reversed front to rear.

Referring to FIG. 11, as the sub-housing 202 rotates upon the second hinge axis A2 in the open state, the stopper protrusion 125 is detached from the operating protrusion 11 and positioned within the hinge housing 101 by elastic the forced from the torsion spring 19a applied thereto. Therefore, the sub-housing 202 can further be opened so that it is even with the main housing 201. The sub-housing 202 can also come to a halt temporarily as the stepping holes 129b are fit into the stepping grooves 137 of the second hinge base 103. As illustrated in FIG. 11, as the sub-housing 202 rotates upon the second hinge axis A2, it closely contacts the main housing 201, with the receiver 223 exposed.

Consequently, the portable terminal 200 is so configured that the stopper 10 of the hinge device 100 protrudes and restricts the angle at which the sub-housing 202 is opened only when the sub-housing 202 rotates upon the first hinge axis A1 with the transmitter 213 and the receiver 223 facing each other. Thus, when the sub-housing 202 rotates upon the second hinge axis A2, the stopper 10 returns within the hinge housing 101, and does not restrict the opened angle of the sub-housing 202.

As described above, the hinge device for the portable terminal according to the embodiments of the present invention provides a first hinge axis perpendicular to the length of the sub-housing and a second hinge axis extending perpendicularly to one surface of the sub-housing. Thus, the sub-housing rotates upon the two axes with respect to the main housing so that it can be placed at various positions. As a result, the portable terminal is convenient to use and meets various user demands. Furthermore, the stopper that restricts the opened angle of the sub-housing to a predetermined angle with respect to the main housing further promotes use convenience.

While the invention has been shown and described with reference to a certain preferred embodiment thereof, it will be understood by those skilled in the art that various changes in form and details may be made therein without departing from the spirit and scope of the invention as defined by the appended claims.

What is claimed is:
1. A hinge device in a portable terminal, comprising:
a first cylindrical hinge base having a longitudinal axis and a stopper protrusion at a predetermined position on an outer circumferential surface thereof, the stopper protrusion extending radially outwardly from said outer circumferential surface;
a second cylindrical hinge base rotatably engaged with an axial end of the first hinge base, facing the first hinge base, said second hinge base being rotatable with respect to said first hinge base about an axis parallel to said longitudinal axis of said first hinge base; and a cylindrical hinge housing within which the second hinge base is fixed, the hinge housing having a stopper which pops in and out of the hinge housing;

wherein the stopper pops radially outward from the hinge housing when the stopper contacts the stopper protrusion.

2. The hinge device of claim 1, wherein the cylindrical hinge housing further comprises:

a stopper hole penetrating through the inner and outer surfaces thereof;

a pair of support members adjacent to both sides of the stopper hole, each of the support members having a pin hole on a surface thereof facing the other support member;

a rotation hole at an end of the stopper; and a pin rotatably inserted into the rotation hole, while both ends of the pin are fixed to the pin holes.

3. The hinge device of claim 2, wherein the cylindrical hinge housing further comprises:

a torsion spring having a coil wound around the pin and first and second free ends extended from both ends of the coil in opposite directions, the first free end being supported by one surface of the stopper and the second free end being supported by the inner circumferential surface of the hinge housing so that the torsion spring provides elastic force in a direction that positions the stopper within the hinge housing.

4. The hinge device of claim 1, wherein the cylindrical hinge housing further comprises:

an elastic member protruding from an outer surface of the stopper at a predetermined height.

5. The hinge device of claim 4, wherein the cylindrical hinge housing further comprises:

a fixing hole penetrating through the inner and outer surfaces of the stopper; and a fixing protrusion formed at one surface of the elastic member, for being inserted into the fixing hole.

6. The hinge device of claim 4, wherein the elastic member is formed of rubber or silicon.

7. The hinge device of claim 1, wherein the cylindrical hinge housing further comprises:

an operating protrusion extended from the inner surface of the stopper, for coming into contact with the stopper protrusion along with rotation of the first hinge base.

8. A hinge device in a portable terminal having a main housing and a sub-housing, the sub-housing being opened from or closed to the main housing by rotating upon a first hinge axis, and facing the main housing by rotating upon a second hinge axis perpendicular to the first hinge axis, and the hinge device providing the first and second hinge axes and connecting the main housing to the sub-housing, the hinge device comprising:

a first hinge base fixed at one end of the main housing and having a longitudinal axis parallel to said second hinge axis and a stopper protrusion at a predetermined position on an outer circumferential surface thereof, and extending radially outward;

a second hinge base rotatably engaged with the first hinge base so that the second hinge base rotates about said longitudinal axis of said first hinge base and comes to a halt at predetermined angular intervals; and a cylindrical hinge housing engaged with an end of the sub-housing so that the hinge housing rotates upon the first hinge axis and having the second hinge base fixed therein, the hinge housing including a stopper which protrudes radially outward from said cylindrical hinge housing when the stopper contacts the stopper protrusion.

9. The hinge device of claim 8, wherein the hinge housing further comprises:

a stopper hole penetrating through the inner and outer surfaces thereof;

a pair of support members adjacent to both sides of the stopper hole, each of the support members having a pin hole on a surface thereof facing the other support member;

a rotation hole at an end of the stopper; and a pin rotatably inserted into the rotation hole, while both ends of the pin are fixed to the pin holes.

10. The hinge device of claim 8, wherein the stopper protrusion protrudes upward from the main housing.

11. The hinge device of claim 8, wherein when the stopper comes into contact with the stopper protrusion and pops out from the outer surface of the hinge housing, the sub-housing is opened at up to or about 160°, rotating upon the first hinge axis.

12. The hinge device of claim 1, wherein the second hinge base rotatably engages an axial end of the first hinge base.

13. The hinge device of claim 1, wherein the stopper protrudes radially inwardly from the cylindrical hinge housing to contact the stopper protrusion upon rotation of the first hinge base relative to the second hinge base.

14. The hinge device of claim 1, wherein said cylindrical hinge housing has a cylindrical side wall and where the stopper extends radially inwardly from said cylindrical side wall.

15. The hinge device of claim 1, wherein said cylindrical hinge housing has a cylindrical side wall to define an internal area, and where said second hinge base is received in said internal area.

* * * * *